Jan. 12, 1971 E. P. GARDNER 3,555,442
TRANSISTORIZED PUSH-PULL AMPLIFIER CIRCUIT
UTILIZING DUAL BIAS SUPPLY
Filed May 12, 1969
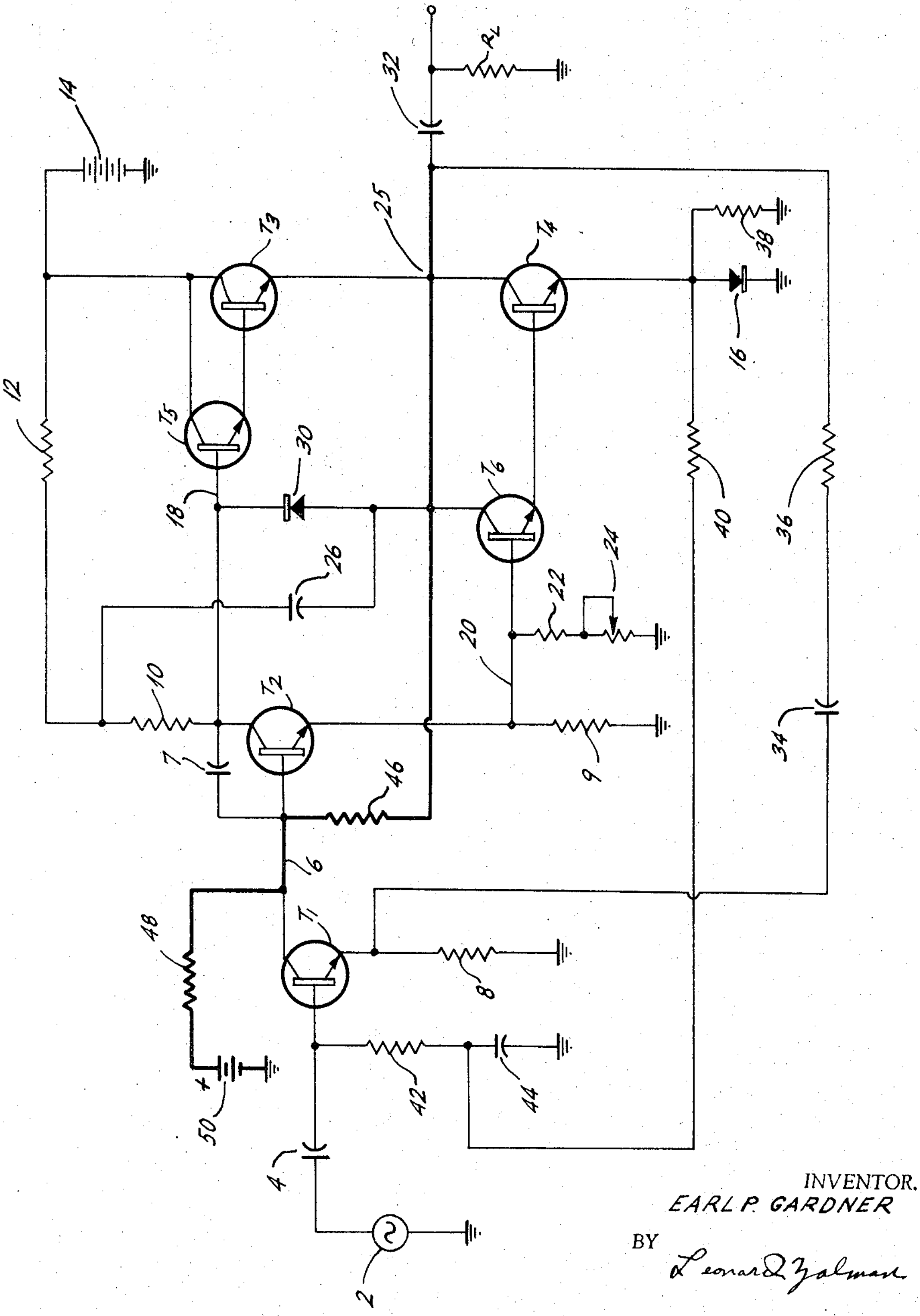
INVENTOR.
EARL P. GARDNER
BY Leonard Zalman
ATTORNEY

United States Patent Office 3,555,442
Patented Jan. 12, 1971

3,555,442

TRANSISTORIZED PUSH-PULL AMPLIFIER CIRCUIT UTILIZING DUAL BIAS SUPPLY

Earl P. Gardner, Philadelphia, Pa., assignor to Philco-Ford Corporation, Philadelphia, Pa., a corporation of Delaware Filed May 12, 1969, Ser. No. 823,860
Int. Cl. H03f 3/26
U.S. Cl. 330—15 7 Claims

ABSTRACT OF THE DISCLOSURE

A direct coupled transistor audio amplifier comprising a phase-splitter stage and a push-pull output stage driven thereby, in which the phase-splitter transistor is biased both from a DC bias supply and the output of the output stage. A first resistor couples the base of the phase-splitter transistor to the output of the output stage and a second resistor, which preferably has a value about four times greater than that of the first resistor, couples the base of the phase-splitter transistor to the bias supply. By use of such biasing the phase-splitter transistor is maintained in Class A operation despite substantial variations in the amplitude of the input signal supplied thereto.

A single-ended push-pull audio amplifier circuit normally comprises a voltage-amplifying input stage, a phase-splitter stage driven thereby and a push-pull output stage driven by the phase-splitter stage. The input stage typically includes a transistor connected in grounded-emitter configuration. The phase-splitter stage typically includes a transistor which has collector and emitter load resistors. The push-pull output stage typically includes two transistors the emitter-collector paths of which are connected in series across a DC power supply and the output load of which is coupled to the interconnection of the emitter of one output transistor and the collector of the other output transistor. The collector of the input transistor is direct-coupled to the base of the phase-splitter transistor, and the emitter and collector of the latter are direct-coupled to the respective bases of the output transistors. To prevent distortion of the output signal, the input and phase-splitter transistors must be biased to operate under Class A conditions and the output transistors must be biased to operate under Class B conditions.

Heretofore the base of the phase-splitter transistor has been biased with respect to its emitter in one of two ways—(1) by supplying a constant voltage thereto from a DC bias supply or (2) by supplying as a biasing potential the output voltage at the interconnection of the two output transistors. Each of these ways permits the operation of the phase-splitter stage undesirably to deviate from Class A conditions, thereby causing distortion of the signal being amplified or sometimes even rendering the amplifier inoperative.

More particularly, when the base bias for the phase-splitter transistor is supplied solely by a DC bias supply e.g., via a series resistor which serves also as the load resistor of the input transistor, the value of the base bias immediately after energization of the circuit often is sufficiently high, due to the small collector current initially drawn through the resistor by the input stage transistor, to drive the phase-splitter transistor into saturation conduction. When the phase-splitter transistor is driven into saturation conduction, that transistor, in turn, drives into saturation conduction the output stage transistor connected to its emitter and drives "hard-off" the transistor connected to its collector. Since leakage current flowing through the emitter-collector path of the latter transistor is very small when that transistor is driven "hard-off" and since that path is the collector load of the other output stage transistor, the emitter current of the other output stage transistor also is small. As a result the voltage developed across the emitter resistor of the saturated output stage transistor which is supplied as a biasing voltage to the base of the input stage transistor, is insufficient to bias the input stage transistor into conduction. Hence biasing the phase-splitter transistor solely from a DC bias supply often allows the various transistors of the amplifier to "lock-up" in undesirable operating states, and in particular prevents the phase-splitter transistor from operating under Class A conditions, and the transistors of the output stage from operating under Class B conditions. As a result, the amplitude of the output signal of the amplifier circuit does not vary linearly in response to changes in the input signal amplitude, but is distorted.

When the bias for the phase-splitter transistor is derived solely from the interconnection point of the two series-connected output transistors, the bias voltage sometimes falls below the minimum value required for conduction of the phase-splitter transistor when one of the output transistors is driven into saturation conduction. When this occurs, a portion of the input signal is clipped, thereby reducing the power output of the amplifier and increasing signal distortion.

Accordingly, it would be desirable to provide a biasing voltage to the base of the phase-splitter transistor which varies in response to changes in input signal amplitude in such a way as always to maintain the phase-splitter transistor in Class A operation.

One object of the present invention is to provide an improved single-ended push-pull type audio amplifier.

Another object is to provide an improved single-ended push-pull type audio amplifier in which clipping of the input signal is reduced.

Another object is to provide a single-ended push-pull type audio amplifier in which the phase-splitter transistor is maintained in Class A operation despite substantial variations in the amplitude of the input signal.

These and other objects of the present invention are achieved by an amplifier in which the bias for the base of the phase-splitter transistor is provided by both a first resistor connected between such base and a DC bias supply, and a second resistor connected between such base and the interconnection point of the series-connected transistors of the push-pull output stage. Preferably, the ratio of the resistance of the first resistor to that of the second resistor is about four to one. The two resistors supply voltages to the base of the phase-splitter transistor which together maintain that transistor in the desired Class A condition.

The invention may be understood fully from the following detailed description with reference to the accompanying drawing in which the sole figure is a schematic diagram of a preferred form of amplifier circuit according to the present invention.

The circuit illustrated schematically in the drawing comprises a voltage-amplifying input stage including an NPN transistor $T_1$, a phase-splitter stage including an NPN transistor $T_2$ driven by the input stage, and a push-pull output stage including NPN transistors $T_3$ and $T_4$ driven by the phase-splitter stage. An impedance matching stage including NPN transistors $T_5$ and $T_6$ couples the phase-splitter stage to the output stage.

A signal source 2 supplies the signal to be amplified to the base of the input stage transistor $T_1$ through a coupling capacitor 4. The collector of input stage transistor $T_1$ is connected directly to the base of phase-splitter transistor $T_2$ by connection 6, and the emitter of transistor $T_1$ is connected to a point at reference potential, e.g. ground, by a resistor 8. A capacitor 7 is connected across the collector-base path of phase-splitter transistor $T_2$ for balancing the capacitance across that path with the capacitance across the emitter-base path of that transistor. An emitter load resistor 9 is connected between the emitter of transistor $T_2$ and ground. Resistors 10 and 12 are connected in series relationship between the collector of transistor $T_2$ and the positive terminal of a DC bias supply 14 which has its negative terminal connected to ground.

A series circuit comprising the collector-emitter path of output stage transistors $T_3$ and $T_4$ and a diode 16 is connected in shunt with source 14. The collector-emitter path of impedance matching transistor $T_5$ is connected in shunt with the collector-base path of output stage transistor $T_3$, and the collector-emitter path of impedance matching transistor $T_6$ is connected in shunt with the collector-base path of output stage transistor $T_4$. The bases of impedance matching transistors $T_5$ and $T_6$ are connected respectively to the collector and the emitter of phase-splitter transistor $T_2$ by connections 18 and 20, respectively. A fixed resistor 22 and a variable resistor 24 are connected serially between the emitter of phase-splitter transistor $T_2$ and ground. The interconnection point 25 of output stage transistors $T_3$ and $T_4$ is coupled both to the junction of resistors 10 and 12 by a capacitor 26, and to the base of impedance matching transistor $T_5$ by a diode 30 which is poled to conduct when the potential at point 25 is more positive than the potential at the base of transistor $T_5$ by an amount equal to the forward blocking voltage of diode 30. Diode 30 prevents punch-through of the emitter-collector paths of transistors $T_3$ and $T_5$.

A capacitor 32 couples interconnection point 25 to one terminal of the load resistor $R_L$ which has its other terminal connected to ground. An AC feedback path is provided between point 25 and the emitter of input stage transistor $T_1$ by a series circuit comprising a capacitor 34 and a resistor 36. The junction of output stage transistor $T_4$ and diode 16 is coupled both to ground through a resistor 38 and to the base of input stage transistor $T_1$ by resistors 40 and 42. Diode 16 acts as a clipper and maintains the value of the bias voltage supplied to the base of the input stage transistor $T_1$ below that value which would drive transistor $T_1$ into saturation conduction. A capacitor 44 couples the junction of resistors 40 and 42 to ground.

In accordance with the invention, the value of the base-emitter bias of phase-splitter transistor $T_2$ is determined by two quantities—(1) a control voltage from a DC bias supply and (2) a control voltage from the output stage—and is such that phase-splitter transistor $T_2$ always operates Class A. More particularly, the base of phase-splitter transistor $T_2$ is coupled by a resistor 46 to interconnection point 25 of the output stage. As will be explained presently, this connection maintains the base bias of the phase-splitter transistor sufficiently low that transistor $T_2$ cannot maintain a saturated conduction condition.

The base of phase-splitter transistor $T_2$ also is connected by a resistor 48 to the positive terminal of a DC bias supply 50. The output voltage of supply 50 is lower than that of supply 14. The voltage supplied via the latter connection maintains the base bias of phase-splitter transistor $T_2$ sufficiently high that transistor $T_2$ does not clip any portion of the input signal. The negative terminal of bias supply 50 is connected to ground.

I have discovered that the circuit operates best when the ratio of the value of resistor 48 to the value of resistor 46 is about four to one. When resistors having respective values satisfying this ratio are employed, neither base bias control voltage can override the other base bias control voltage to such an extent as to cause an undesired mode of operation.

In operation, resistors 46 and 48 to a large extent, and the remaining components of the circuit to a lesser extent, establish at point 25 the quiescent voltage required for push-pull operation of output stage transistors $T_3$ and $T_4$. For proper push-pull operation this voltage should be about one half the value of bias supply 14. Variable resistor 24 provides a means for adjusting to this value the quiescent voltage at point 25.

Output stage transistors $T_3$ and $T_4$ are alternately operative, i.e., they operate under Class B conditions to amplify the signal from source 2 and supply it to load resistor $R_L$. Thus when a positive-going signal is supplied to the base of input stage transistor $T_1$, the collector voltage of transistor $T_1$, and hence the base voltage of phase-splitter transistor $T_2$, becomes less positive. As a result, the collector voltage of phase-splitter transistor $T_2$ becomes more positive (i.e. increases) and the emitter voltage thereof becomes less positive (i.e. decreases). The decreased emitter voltage cut off transistor $T_6$ (to the base of which such voltage is applied), thereby causing transistor $T_4$ also to be cut off. In contrast the increased voltage at the collector of transistor $T_2$ drives transistors $T_5$ and $T_3$ into conduction. Under these conditions, current flows from the positive terminal of source 14 through transistor $T_3$, capacitor 32 and load resistor $R_L$ to ground, thereby charging capacitor 32 and producing across resistor $R_L$ an output voltage corresponding to the positive-going input signal.

When a negative-going signal is supplied to the base of input transistor $T_1$, the collector voltage of phase-splitter transistor $T_2$ decreases and the emitter voltage thereof increases. The increased emitter voltage drives transistors $T_4$ and $T_6$ into conduction, and the decreased collector voltage drives transistors $T_3$ and $T_5$ off. Capacitor 32 then discharges through transistor $T_4$, diode 16 and load resistor $R_L$, and an output signal corresponding to the negative-going input signal is produced across resistor $R_L$. Accordingly, the circuit provides a push-pull output signal in response to a single-ended input signal. The AC feedback provided by capacitor 34 and resistor 36 reduces distortion in the output signal.

In accordance with the invention, the control voltage supplied via the connection between the base of phase-splitter $T_2$ and point 25 lowers the base bias of phase-splitter transistor $T_2$ in the event that that bias momentarily rises to a value which drives transistor $T_2$ into saturation conduction. More particularly, as discussed heretofore, saturation conduction of phase-splitter transistor $T_2$ drives output stage transistor $T_4$ into saturation conduction and cuts off transistor $T_3$. Under these conditions, the potential at point 25 decreases, since most of the voltage drop across the output stage transistors is now across the emitter-collector path of the cut off transistor $T_3$. This decrease in potential at point 25 is transmitted via resistor 46 to the base of transistor $T_2$ and causes a decrease in the base bias of phase-splitter transistor $T_2$. In response to the decreased bias voltage, transistor $T_2$ ceases saturation conduction and resumes Class A operation.

Also in accordance with the invention, the control voltage supplied via the connection between the base of phase-splitter transistor $T_2$ and source 50 increases the base bias of phase-splitter transistor $T_2$ in the event that that bias momentarily falls to a value which causes phase-splitter transistor $T_2$ to clip a negative-going portion of the input signal. More particularly, as discussed heretofore, when the base bias of phase-splitter transistor $T_2$ is derived solely from point 25, saturation conduction of output stage transistor $T_4$ may decrease the potential at point 25 sufficiently that a portion of the input signal is clipped. However, in accordance with the invention, the positive bias voltage supplied by source 50 via resistor 46 to the base of transistor $T_2$ opposes the decreased voltage supplied by point 25 sufficiently to maintain the effective base-emitter bias of transistor $T_2$ above the value at which it would clip any portion of the input signal. Thus the two voltages supplied to the base of transistor $T_2$ sum to produce at that base a resultant bias voltage in the range required for Class A operation of transistor $T_2$.

The components of the circuit illustrated in the drawing typically may have the following values:

Resistor 8—150 ohms
Resistor 9—620 ohms
Resistor 10—470 ohms
Resistor 12—3.9K
Resistor 22—820 ohms
Resistor 36—1K
Resistor 38—39 ohms
Resistor 40—1.5K
Resistor 42—33K
Resistor 46—68K
Resistor 48—270K
Capacitor 4—.068 microfarad
Capacitor 7—27 picofarads
Capacitor 26—200 microfarads
Capacitor 32—500 microfarads
Capacitor 34—.22 microfarad
Capacitor 44—100 microfarads
Source 14—41.5 volts
Source 50—22 volts
Transistor $T_1$—Philco-Ford No. HR47
Transistor $T_2$—Philco-Ford No. HR65
Transistors $T_3$ and $T_4$—Philco-Ford No. HR107
Transistors $T_5$ and $T_6$—Philco-Ford No. HR67
Diode 16—Philco-Ford No AD4
Diode 30—Philco-Ford No. AD5.

The foregoing values and types are merely explanatory and the invention is not limited thereby. For example, all of the transistors may be reversed as to type, and sources 14 and 50 may be replaced by a single source having taps at the desired voltage levels of sources 14 and 50.

In addition, although the ratio of the respective resistances of resistor 48 and resistor 46 preferably is about four to one in the specific embodiment taught herein, this ratio may have any other value which will cause the summed voltages respectively supplied from source 50 and point 25 to produce a bias between the base and emitter of transistor $T_2$ which maintains that transistor in Class A operation for all input signals having amplitudes within the range intended to be amplified by the circuit.

I claim:

1. In an amplifier circuit, comprising:

first and second transistors of the same conductivity type, each of said transistors comprising an emitter, a collector and a base, means connecting at a junction said emitter of said first transistor to said collector of said second transistor, first means for supplying a direct current bias in series relationship with the series-connected emitter-collector paths of said first and second transistors, second means for supplying a time-varying signal to said first transistor in a first phase and to said second transistor in a phase opposite said first phase so as to drive said first and second transistors in push-pull, said second means including a third transistor of said same conductivity type having an emitter, a collector and a base, means for directly coupling said collector of said third transistor to said base of said first transistor, and means for directly coupling said emitter of said third transistor to said base of said second transistor, and load means coupled between said junction and a point at reference potential, the improvement comprising:

third means for establishing the base-emitter bias of said third transistor at a value for which said third transistor operates under Class A conditions, said third means comprising (a) a fourth transistor of said same conductivity type having an emitter, a collector and a base, means for applying a biasing potential to said base of said fourth transistor, means directly connecting said collector of said fourth transistor to said base of said third transistor, means including first resistive means for applying to said collector of said fourth transistor and to said base of said third transistor a potential for reverse-biasing the base-collector path of said fourth transistor and for forward-biasing the base-emitter path of said third transistor, and (b) means including second resistive means, for directly connecting said junction to said base of said third transistor.

2. A circuit according to claim 1 wherein said first resistive means has a value about four times greater than the value of said second resistive means.

3. A circuit according to claim 7 further including means for supplying a signal to said base of said fourth transistor, and means for feeding back solely a time-varying signal from said junction to said emitter of said fourth transistor.

4. A circuit according to claim 3 wherein said second means further includes a variable resistor connected between the emitter of said third transistor and said point at reference potential.

5. An amplifier circuit according to claim 1, wherein said means for applying a biasing potential to said base of said fourth transistor includes means supplied with and responsive to the emitter current of said second transistor to produce said biasing potential, and means for conducting said biasing potential to said base of said fourth transistor.

6. A circuit according to claim 1, wherein said first means includes a first source of direct voltage of given value, said first source having two terminals, means for connecting one of said two terminals to said point at reference potential, and means for connecting said collector of said first transistor to the other of said two terminals, said source being poled so as to apply to said collector of said first transistor a potential reverse-biasing said base-collector path of said first transistor;

said circuit further includes third resistive means connecting said emitter of said fourth transistor to said point at reference potential;

said means for applying a biasing potential to said base of said fourth transistor comprises means, connecting said emitter of said second transistor to said point at reference potential, for producing a unidirectional bias voltage in response to emitter current of said second transistor, and resistive means for supplying said unidirectional bias voltage to said base of said fourth transistor, said means for applying said potential to said collector of said fourth transistor comprises a second source of a direct voltage having a value less than said given value, said second source having two terminals, means for connecting one of said terminals of said second source to said point at reference potential, said first resistive means connecting the other of said terminals of said second source to said collector of said fourth transistor and said base of said third transistor, and said second means further includes fourth resistive means connecting said emitter of said third transistor to said point at reference potential and fifth resistive means connecting said collector of said third transistor to said other terminal of said first source.

7. A circuit according to claim 6, wherein said means for directly coupling said collector of said third transistor to said base of said first transistor comprises a fifth transistor of said same conductivity type, having an emitter connected to said base of said first transistor, a collector connected to said collector of said first transistor, and a base connected to said collector of said third transistor, and said means for directly coupling said emitter of said third transistor to said base of said second transistor comprises a sixth transistor of said same conductivity type, having an emitter connected to said base of said second transistor, a collector connected to said collector of said second transistor and a base connected to said emitter of said third transistor.

References Cited

UNITED STATES PATENTS

| | | | |
|---|---|---|---|
| 3,246,251 | 4/1966 | Sheppard | 330—14 |
| 3,439,284 | 4/1969 | Carlson | 330—15 |
| 3,454,889 | 7/1969 | Petrie | 330—15 |

ROY LAKE, Primary Examiner

L. J. DAHL, Assistant Examiner

U.S. Cl. X.R.

330—22, 25